(12) United States Patent
Lee (10) Patent No.: US 9,274,881 B2
(45) Date of Patent: Mar. 1, 2016

(54) SEMICONDUCTOR MEMORY DEVICE, MEMORY SYSTEM INCLUDING THE SAME, AND OPERATING METHOD THEREOF

(71) Applicant: SK hynix Inc., Icheon-si Gyeonggi-do (KR)

(72) Inventor: Hee Youl Lee, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 27 days.

(21) Appl. No.: 14/296,959

(22) Filed: Jun. 5, 2014

(65) Prior Publication Data
US 2015/0187420 A1 Jul. 2, 2015

(30) Foreign Application Priority Data
Dec. 30, 2013 (KR) .................. 10-2013-0167317

(51) Int. Cl.
| | |
|---|---|
| G11C 15/04 | (2006.01) |
| G06F 11/10 | (2006.01) |
| G11C 11/56 | (2006.01) |
| G11C 16/04 | (2006.01) |
| G11C 16/16 | (2006.01) |
| G11C 16/20 | (2006.01) |
| G11C 16/34 | (2006.01) |
| H01L 27/115 | (2006.01) |

(52) U.S. Cl.
CPC ............ *G06F 11/10* (2013.01); *G11C 11/5671* (2013.01); *G11C 15/046* (2013.01); *G11C 16/0466* (2013.01); *G11C 16/16* (2013.01); *G11C 16/20* (2013.01); *G11C 16/3422* (2013.01); *H01L 27/11582* (2013.01)

(58) Field of Classification Search
CPC ...... G11C 15/043; G11C 15/04; G11C 15/00; G11C 7/1006; G11C 7/1084; G11C 16/0483; G11C 16/16; G11C 16/12; G11C 14/00; G11C 14/0018
USPC .................. 365/49.1, 49.17, 185.17, 185.33, 365/185.03, 185.22
See application file for complete search history.

(56) References Cited

U.S. PATENT DOCUMENTS

| | | | | |
|---|---|---|---|---|
| 8,923,046 B2 * | 12/2014 | Noh | .................... | G11C 11/5628 365/185.03 |
| 2008/0316787 A1 * | 12/2008 | Kawabata | .............. | G11C 15/00 365/49.1 |
| 2013/0163324 A1 * | 6/2013 | Noh | .................... | G11C 11/5628 365/185.02 |

FOREIGN PATENT DOCUMENTS

| | | | |
|---|---|---|---|
| KR | 1020090041764 A | 4/2009 | |
| KR | 1020130032502 A | 4/2013 | |

* cited by examiner

*Primary Examiner* — Gene Auduong
(74) *Attorney, Agent, or Firm* — William Park & Associates Ltd.

(57) ABSTRACT

The memory system includes a semiconductor memory device including a CAM data block for storing CAM data, and a controller configured to control an operation of the semiconductor memory device in response to a CAM data program command received from a host, wherein the semiconductor memory device is configured to perform a pre-program operation and an erase operation of the CAM data block prior to the performance of a CAM data program operation associated with the CAM data block.

16 Claims, 9 Drawing Sheets

SEMICONDUCTOR MEMORY DEVICE, MEMORY SYSTEM INCLUDING THE SAME, AND OPERATING METHOD THEREOF

CROSS-REFERENCE TO RELATED APPLICATION

The present application claims priority to Korean patent application number 10-2013-0167317 filed on Dec. 30, 2013, in the Korean Intellectual Property Office, the entire disclosure of which is incorporated by reference herein.

BACKGROUND

1. Technical Field

Embodiments relates to a semiconductor memory device, a memory system including the same, and an operating method thereof.

2. Related Art

A semiconductor memory device is a memory device typically implemented by using a semiconductor material, such as for example, silicon (Si), germanium (Ge), gallium arsenide (GaAs), and indium phosphide (InP). The semiconductor memory device is generally classified as a volatile memory device or a nonvolatile memory device.

A volatile memory device is a memory device where the stored data dissipates when a power supply to the volatile memory device is discontinued. Examples of volatile memory devices include, but are not limited to, a Static RAM (SRAM), a Dynamic RAM (DRAM), and a Synchronous DRAM (SDRAM). A nonvolatile memory device is a memory device where the stored data is maintained when a power supply to the nonvolatile memory device is discontinued. Examples of nonvolatile memory devices include, but are not limited to, a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), and a Ferroelectric RAM (FRAM). Flash memories are generally classified as a NOR type flash memory device or a NAND type flash memory device.

The flash memory device may be a 2-dimensional semiconductor device where strings are formed in parallel on a semiconductor substrate or a 3-dimensional semiconductor device where strings are vertically formed on a semiconductor substrate.

The strings in a 3-dimensional semiconductor memory device include a drain select transistor, memory cells, and a source select transistor electrically coupled between a bit line and a source line.

The 3-dimensional semiconductor device may include charge trap memory cells. In such a 3-dimensional semiconductor device, a Contents Addressable Memory (CAM) cell for storing CAM data is a charge trap memory cell. In some cases, when a charge trap memory cell is utilized as a CAM cell, the CAM data is programmed in the CAM cell when the CAM cell is in an erase state prior to packaging a memory chip. Electrons may be trapped within the charge trap memory cell being used as a CAM cell. When a CAM cell programmed with CAM data is subjected to relatively high temperatures associated with the packaging process, the electrons may move within a charge storage layer of the CAM cell or may recombine with holes in the charge storage layer. A threshold voltage within the charge trap memory cell may be changed.

SUMMARY

An embodiment of a memory system, includes a semiconductor memory device including a CAM data block for storing CAM data, and a controller configured to control an operation of the semiconductor memory device in response to a CAM data program command received from a host, wherein the semiconductor memory device is configured to perform a pre-program operation and an erase operation of the CAM data block prior to performance of a CAM data program operation associated with the CAM data block.

An embodiment of a semiconductor memory device, includes a memory cell array including a CAM data block, a peripheral circuit configured to perform a pre-program operation, an erase operation, and a CAM data program operation of the CAM data block, and a control logic configured to issue at least one command to the peripheral circuit to perform the pre-program operation and the erase operation prior to issuance of a CAM data program command to the peripheral circuit to perform.

An embodiment of a method of operating a semiconductor memory device, includes receiving a CAM data program command at a semiconductor memory device including a CAM data block, performing a pre-program operation and an erase operation on the CAM data block, and programming CAM data on the CAM data block following the performance of the pre-program operation and the erase operation.

DETAILED DESCRIPTION

Figure 1:
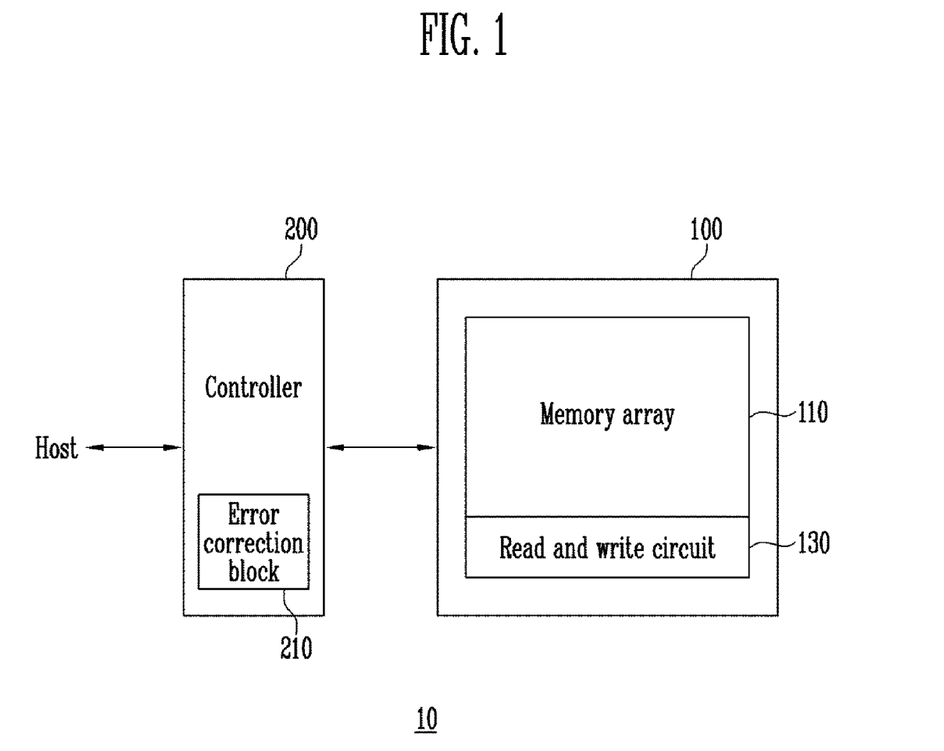
FIG. 1 is a block diagram representation of a memory system including an embodiment of a semiconductor memory device.

FIG. 1 is a block diagram representation of a memory system 10 including an embodiment of a semiconductor memory device 100.

The memory system 10 includes the semiconductor memory device 100 and a controller 200. The semiconductor memory device 100 includes a memory cell array 110, and a read and write circuit 130 electrically coupled to the memory cell array 110.

The memory cell array 110 includes a plurality of memory cells (not shown). Each of the plurality of memory cells may be a multi-level memory cell. A multi-level memory cell can be used to store two or more data bits.

The semiconductor memory device 100 is operated in response to commands received from the controller 200. The semiconductor memory device 100 is configured to perform a CAM data program operation on memory cells (selected memory cells). The selected memory cells are identified by an address received from the controller 200. The address is typically received at the semiconductor memory device 100 with a command associated with the CAM data program operation. The semiconductor memory device 100 performs a pre-program operation and an erase operation a predetermined number of times prior to the performance of the CAM data program operation in response to the received command from the controller 200.

In an embodiment, the semiconductor memory device 100 may be a flash memory device. However, the semiconductor memory device 100 is not limited to a flash memory device.

The controller 200 is electrically coupled to the semiconductor memory device 100 and to a host. The controller 200 is configured to interface with the host and with the semiconductor memory device 100. For example, when a CAM data program operation is requested by the host, the controller 200 receives the request from the host. The controller 200 may convert a logical block address received from the host into a physical block address, and provide the semiconductor memory device 100 with the converted physical block address along with a corresponding command in response to the CAM data program operation request received from the host.

In an embodiment, the controller 200 includes an error correction block 210. The error correction block 210 is configured to detect and correct an errors in data received from the semiconductor memory device 100. An error correction function performed by the error correction block 210 is limited to the number of error bits in the data received from the semiconductor memory device 100. When the number of error bits in the data received from the semiconductor memory device 100 is less than a specific value, the error correction block 210 performs an error detection and correction function. When the number of error bits in the data received from the semiconductor memory device 100 is greater than the specific value, the error detection and correction function is not performed. When the number of error bits in the data received from the semiconductor memory device 100 is greater than the specific value, the controller 200 issues one or more commands to the semiconductor memory device 100 to adjust a read voltage applied to a selected word line.

Figure 2:
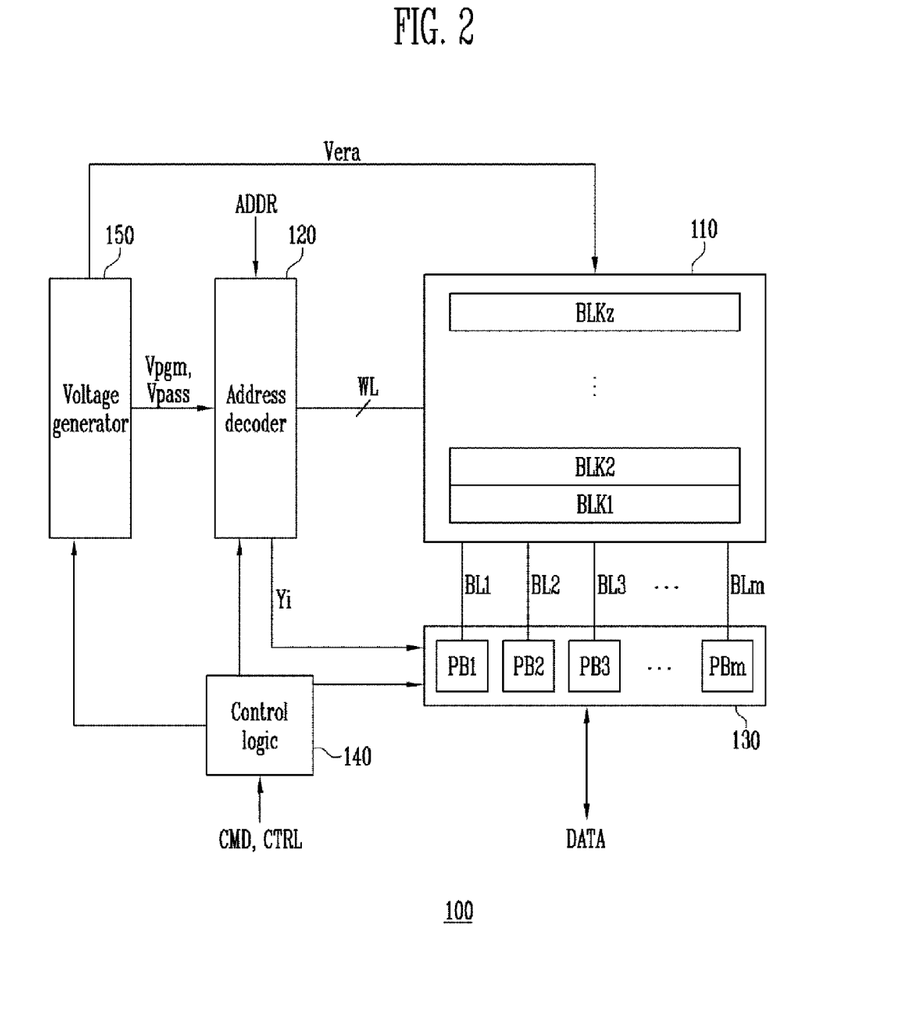
FIG. 2 is a block diagram representation of an embodiment of the semiconductor memory device of FIG. 1.

FIG. 2 is a block diagram representation of an embodiment of the semiconductor memory device of FIG. 1.

The semiconductor memory device 100 includes the memory cell array 110, an address decoder 120, the read and write circuit 130, a control logic 140, and a voltage generator 150.

The memory cell array 110 includes a plurality of memory blocks BLK1-BLKz. One or more of the plurality of memory blocks BLK1-BLKz are defined as CAM blocks. CAM data is programmed in the CAM blocks. For example, in an embodiment, the last memory block BLKz in the plurality of memory blocks BLK1-BLKz is defined as the CAM block. The plurality of memory blocks BLK1 t-BLKz is electrically coupled to the address decoder 120 via word lines WL. The plurality of memory blocks BLK1-BLKz are electrically coupled to the read and write circuit 130 via bit lines BL1-BLm. Each of the memory blocks BLK1-BLKz includes a plurality of memory cells. In an embodiment, the plurality of memory cells are charge trap memory cells. In an embodiment, the charge trap memory cells have a 3-dimensional structure or a 3-dimensional architecture. The memory cells connected to the single word line are defined as one page. The memory cell array includes a plurality of pages.

In an embodiment, the plurality of memory cells are charge trap memory cells having the 3-dimensional architecture. In an embodiment the charge trap cells include a 2-dimensional SONOS structure. In an embodiment, the charge trap cells include a 2-dimensional MANOS structure.

The address decoder 120, the read and write circuit 130, and the voltage generator 150 are peripheral circuits that drive the memory cell array 110.

The address decoder 120 is electrically coupled to the memory cell array 110 via the word lines WL. The address decoder 120 is configured to be operated in response to one or more commands received from the control logic 140. The address decoder 120 receives an address ADDR via an input/output buffer (not shown) disposed within the semiconductor memory device 100. The address ADDR is received from the controller 200 (see FIG. 1).

The address decoder 120 receives a number of addresses ADDR during the pre-program operation and the CAM data program operation. The received addresses ADDR include a row address. The address decoder 120 is configured to decode the row address, to apply a program voltage Vpgm generated by the voltage generator 150 to a selected word line associated with the decoded row address, and to apply a pass voltage Vpass to the remaining word lines.

The addresses ADDR received at the address decoder 120 includes a column address. The address decoder 120 is configured to decode the column address. The address decoder 120 transmits the decoded column address Yi to the read and write circuit 130.

The pre-program operation and the CAM data program operation of the semiconductor memory device 100 are performed in units. In an embodiment, the unit is a page. The pre-program operation is to program the same data. The pre-program operation may be performed in units. In an embodiment, the unit is a block. The address decoder 120 selects one memory block and one word line based on the received block address and the received row address. The column address is decoded by the address decoder 120 and provided to the read and write circuit 130.

The address decoder 120 may, for example, include but is not limited to, a block decoder, a row decoder, a column decoder, and an address buffer.

The read and write circuit 130 includes a plurality of page buffers PB1-PBm. The plurality of page buffers PB1-PBm are electrically coupled to the memory cell array 110 via the bit lines BL1-BLm. Each of the page buffers PB1-PBm receives set pre-program data (such as for example, data 0) during the pre-program operation, temporarily stores the received pre-program data, and sets a potential of a corresponding bit line with a program permission voltage. Each of the page buffers PB1-PBm receives CAM data DATA during the CAM data program operation, temporarily stores the received CAM data DATA, and sets a potential of a corresponding bit line with a program permission voltage or a program prohibition voltage.

The read and write circuit 130 is operated in response to one or more commands received from the control logic 140.

In an embodiment, the read and write circuit 130 may include, but is not limited to, the page buffers (or page registers), and a column selection circuit.

The control logic 140 is electrically coupled to the address decoder 120, the read and write circuit 130, and the voltage generator 150. The control logic 140 receives a command CMD and a control signal CTRL via the input/output buffer (not shown) of the semiconductor memory device 100. The command CMD and the control signal CTRL are received from the controller 200 (see FIG. 1). The control logic 140 is configured to issue one or more commands associated with the operation of the semiconductor memory device 100 in response to the command CMD and the control signal CTRL. When the command CMD for the CAM data program operation is received, the control logic 140 performs the pre-program operation and the erase operation on the memory block BLKz (defined as the CAM block) the predetermined number of times by issuing one or more commands to the address decoder 120, the read and write circuit 130, and the voltage generator 150. The control logic 140 issues one or more commands to perform the CAM data program operation following the performance of the pre-program operation and the erase operation.

The voltage generator 150 generates a program voltage Vpgm and a pass voltage Vpass during the pre-program operation and the CAM data program operation. The voltage generator 150 generates a plurality of program voltages Vpgm where the voltage generator 150 sequentially increases the value of the voltage in accordance with one or more commands received from the control logic 140 during the performance of a program operation using an Incremental Step Pulse Program (ISPP) method.

Figure 3:
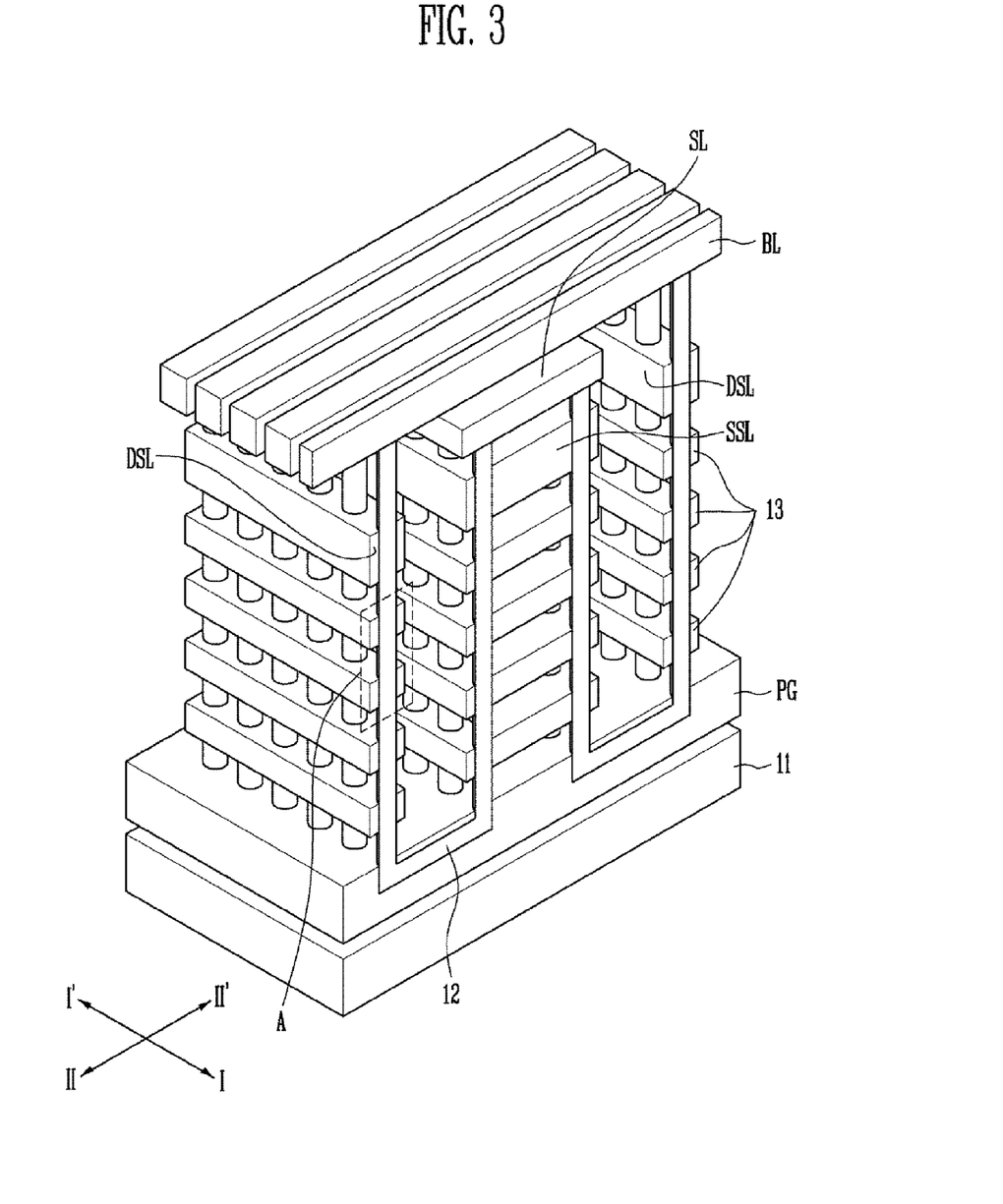
FIG. 3 is a perspective view of an embodiment of a memory cell array.

Referring to FIG. 3, a perspective view of an embodiment of a memory cell array is shown.

The memory cell array includes an insulating layer (not shown).

An embodiment of the semiconductor memory device includes a pipe gate PG stacked on a substrate 11, a plurality of conductive patterns 13, one or more drain selection lines DSL, and one or more source selection lines SSL. A U-shaped through-structure 12 passes through the plurality of conductive patterns 13 and the pipe gate PG.

The plurality of conductive patterns 13, the drain selection lines DSL, and the source selection lines SSL have a stacked configuration and surround the through-structure 12. The U-shaped through-structure 12 is electrically coupled to the bit lines BL and to the source line SL.

A source selection transistor is formed at a junction where a source side channel layer S_CH and the through-structure 12 cross each other. The memory cells are formed at the junctions where the plurality of conductive patterns 13 and the through-structure 12 cross each other. A pipe transistor is formed at a junction where the pipe gate PG and the through-structure 12 cross each other. A drain selection transistor is formed at a junction where the through-structure 12 and the drain selection line DSL cross each other.

The drain selection transistor, the plurality of memory cells, the pipe transistor, the plurality of memory cells, and the source selection transistor are electrically coupled serially and form a single string. The strings are arranged in a generally "U" shape.

In an embodiment, the strings are arranged in the generally "U" shape. In an embodiment the strings are arranged to have a generally straight configuration, where a common source line is formed on the semiconductor substrate 11, the bit lines are formed on the common source line, and the string having a generally straight structure is formed between the bit lines and the common source line.

Region A is a partial region including a through structure.

Figure 4:
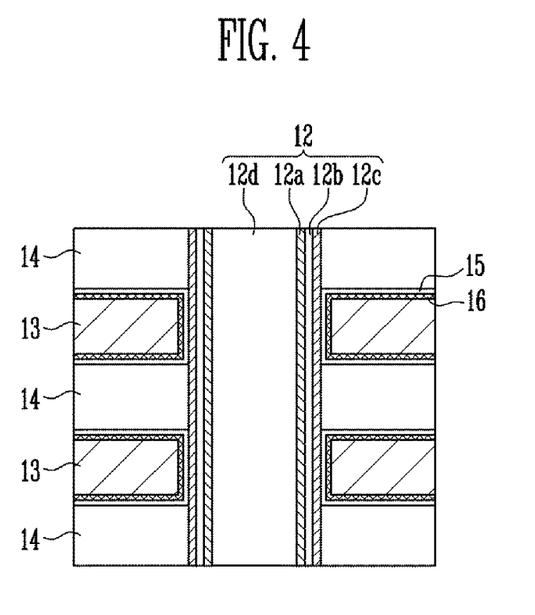
FIG. 4 is a cross-sectional view of an enlarged version of the region A of FIG. 3.

Referring to FIG. 4 a cross-sectional view of an enlarged view of the region A of FIG. 3 is shown.

The through structure 12 includes a channel layer 12a passing through alternately stacked insulating patterns 14 and conductive patterns 13, a tunnel insulating layer 12b surrounding a lateral wall of the channel layer 12a, and a charge storage layer 12c surrounding the tunnel insulating layer 12b. The channel layer 12a may be formed of a polysilicon layer. The tunnel insulating layer 12b may be formed using at least one of a thermal oxide layer, a radical oxide layer, a dry oxide layer, and a wet oxide layer. The charge storage layer 12c may be formed of a nitride layer. A center region of the through structure 12 may be filled with an insulating layer 12d. A blocking insulating layer 15 and a barrier layer 16 may be formed between the conductive patterns 13 and the through structure 12.

Figure 5:
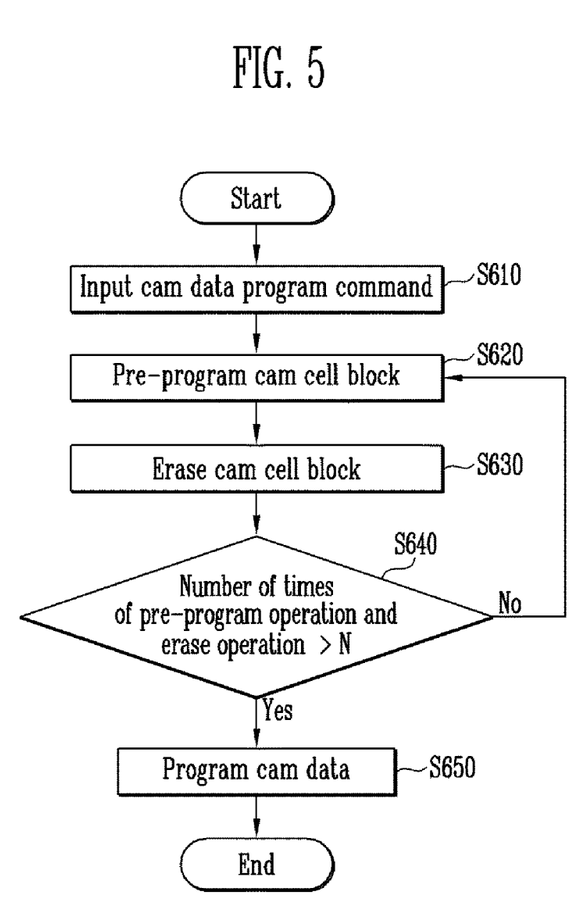
FIG. 5 is a flowchart representation of an embodiment of an operation associated with programming CAM data.

FIG. 5 is a flowchart representation of an embodiment of an operation associated with programming CAM data.

FIGS. 6A to 6E are diagrams representing distributions of electrons (e) and/or the holes (h) in a charge storage layer 12c of a charge trap memory cell under a number of different conditions.

An operation of an embodiment of the semiconductor memory device will be described below with reference to FIGS. 1 to 5 and 6A to 6E.

A CAM data program command is received from a host (S610) at a controller 200. The controller 200 responsively transmits an address ADDR corresponding to a layer and a CAM cell block associated with the received CAM data program command to the semiconductor memory device 100. An example of the CAM cell block is BLKz.

Figure 6A:
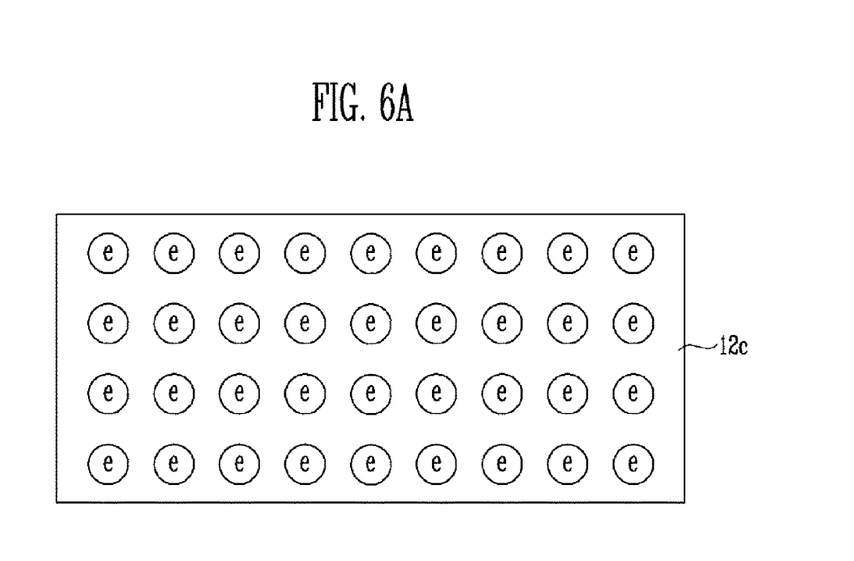
FIGS. 6A to 6E are diagrams representing distributions of electrons and/or holes in a charge storage layer of a charge trap memory cell under a number of different conditions.

The control logic 140 performs a pre-program operation on the CAM cell block BLKz by issuing one or more commands to the address decoder 120, the read and write circuit 130, and the voltage generator 150 (S620). The CAM cell block BLKz may be in an erase state. The pre-program operation programs the threshold voltages of all of the memory cells within the CAM cell block BLKz to have a predetermined value. The predetermined value may, for example, be greater than 0 V. Referring to FIG. 6A, electrons (e) are injected into the charge storage layer 12C of the charge trap type memory cell within the CAM cell block BLKz during the pre-program operation.

The pre-program operation may be performed on all of the charge trap memory cells within the CAM cell block BLKz, or may be performed on a selected subset of the charge trap memory cells. The subset of the charge trap memory cells may be selected during a subsequent CAM data program operation.

When the pre-program operation is performed on the selected subset of the charge trap memory cells, the charge storage layer 12c of the non-selected charge trap memory cells are filled with holes (h). The charges are not significantly re-arrangement and there is a relatively lower likelihood of a read disturbance.

Figure 6B:
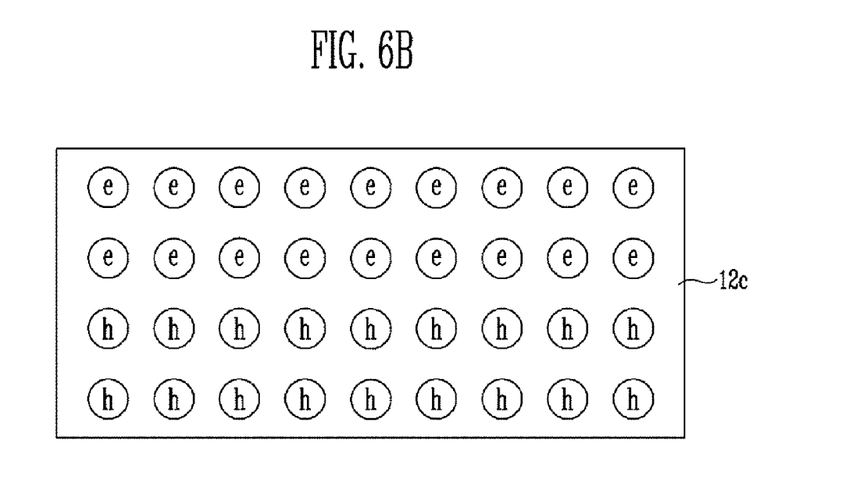

When the pre-program operation is completed, the control logic 140 performs an erase operation of the CAM cell block BLKz by issuing one or more commands to the address decoder 120, the read and write circuit 130, and the voltage generator 150 (S630). Referring to FIG. 6b, the electrons in a lower portion of the charge storage layer 12c are detrapped or holes (h) are injected into the charge storage layer 12C of the charge trap memory cell within the CAM cell block BLKz by the erase operation.

The control logic 140 repeats the pre-program operation S620 and the erase operation S630 a predetermined number N of times.

When the pre-program operation S620 and the erase operation S630 are repeatedly performed, the number of electrons (e) in the charge storage layer 12c of the charge trap memory cell within the CAM cell block BLKz increases as illustrated in FIG. 6A.

When it is determined that the number of times that the pre-program operation S620 and the erase operation S630 have been performed is greater than the predetermined number N of times S640, the control logic 140 programs CAM data DATA in the CAM cell block BLKz by issuing one or more commands to the address decoder 120, the read and write circuit 130, and the voltage generator 150 S650.

Figure 6C:
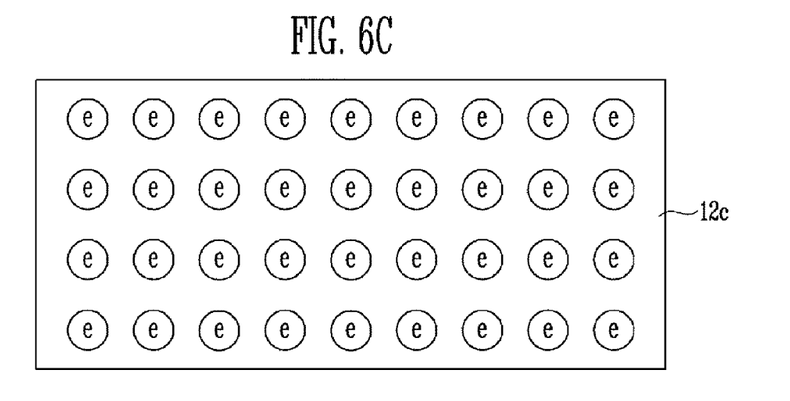

When a CAM data program operation S650 is performed within a relatively short period of time following the completion of the erase operation S630 of the CAM cell block BLKz, the charge storage layer 12c of the charge trap memory cell within the CAM cell block BLKz is filled with the electrons (e) as illustrated in FIG. 6C. An electric field is not generated within the charge storage layer 12c. Since there are typically no the holes (h) present, an increase in an external temperature does not result in a significant change in a threshold voltage.

Figure 6D:
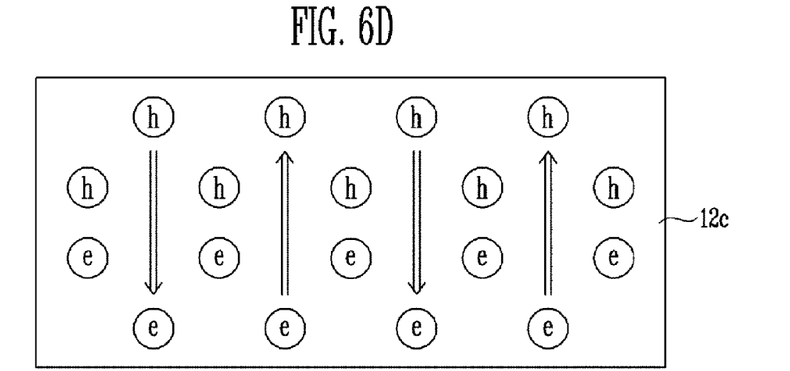
Figure 6E:
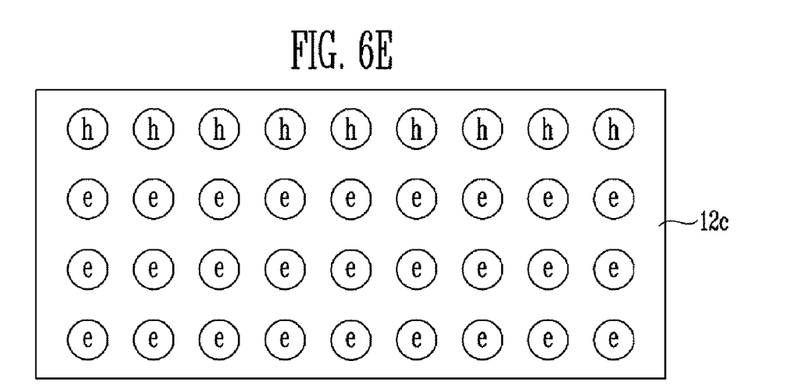

When a relatively longer period of time passes following the completion of the erase operation S630 of the CAM cell block BLKz, the electrons (e) and the holes (h) in the charge storage layer 12c may be re-distributed as illustrated in FIG. 6D. However, when the CAM data program operation S650 is performed, the holes (h) are present in an the upper portion of the charge storage layer 12c as illustrated in FIG. 6E. The recombination and rearrangement of the electrons (e) and the holes (h) in the charge storage layer 12c is reduced.

In an embodiment of the semiconductor memory device and the operating method, when CAM data is programmed in the semiconductor memory device including the charge trap memory cell, the pre-program operation and the erase operation are repeatedly performed a predetermined number of times, prior to the performance of the CAM data program operation. An improvement in the reliability of the CAM data program operation may occur.

Figure 7:
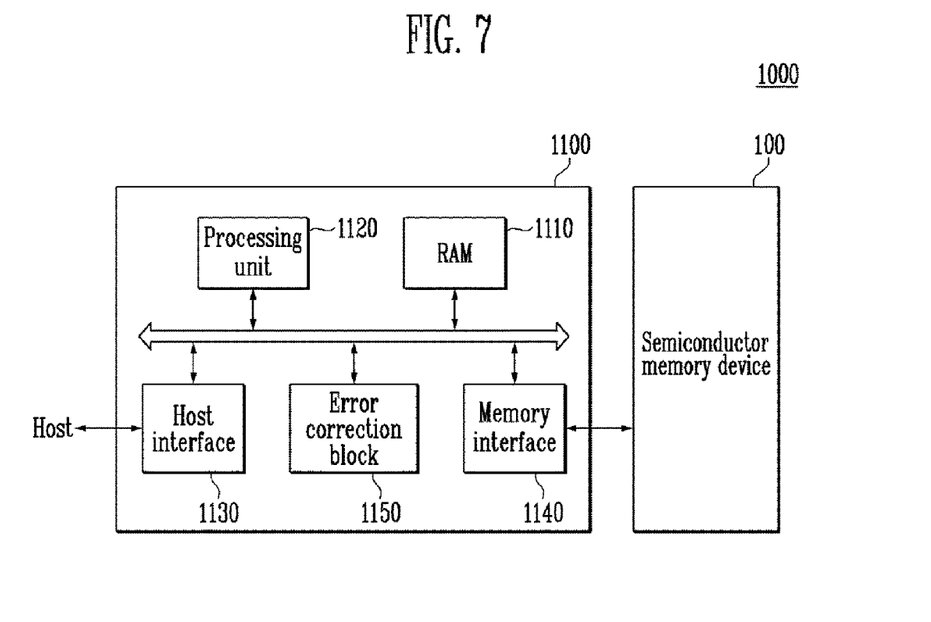
FIG. 7 is a block diagram representation of a memory system including an embodiment of the semiconductor memory device of FIG. 2.

FIG. 7 is a block diagram representation of a memory system 1000 including an embodiment of the semiconductor memory device 100 of FIG. 2.

The memory system 1000 includes a semiconductor memory device 100 and a controller 1100.

The semiconductor memory device 100 may be configured and operated in a similar manner to the semiconductor memory device described with reference to FIG. 2.

The controller 1100 may be configured to perform in a similar manner to the controller 200 described with reference to FIG. 1. The controller 1100 is electrically coupled to a host and to the semiconductor memory device 100. The controller 1100 is configured to access the semiconductor memory device 100 in response to a request from the host. For example, the controller 1100 is configured to control read, write, erase, and background operations of the semiconductor memory device 100. The controller 1100 is configured to provide an interface between the semiconductor memory device 100 and the host. The controller 1100 is configured to drive a firmware for controlling the semiconductor memory device 100.

The controller 1100 includes a Random Access Memory (RAM) 1110, a processing unit 1120, a host interface 1130, a memory interface 1140, and an error correction block 1150. The RAM 1110 is configured to be used as at least one of a working memory of the processing unit 1120, a cache memory between the semiconductor memory device 100 and the host, and a buffer memory between the semiconductor memory device 100 and the host. The processing unit 1120 controls a general operation of the controller 1100. The controller 1100 may temporarily store program data received from the host during the write operation.

The host interface 1130 includes a protocol for performing a data exchange between the host and the controller 1100. In an embodiment, the controller 1200 is configured to communicate with the host using at least one of various interface protocols. Examples of such interface protocols include, but are not limited to, a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1140 interfaces with the semiconductor memory device 100. For example, the memory interface includes a NAND interface or a NOR interface.

The error correction block 1150 performs the same function as the error correction block 210 of FIG. 1. The error correction block 1150 is configured to detect and correct an error of the data received from the semiconductor memory device 100 using an Error Correction Code (ECC). The processing unit 1120 may control the semiconductor memory device 100 and adjust a read voltage based on a result of the error detection performed by the error correction block 1150 and perform a re-read operation. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to configure a memory card. For example, the controller 1100 and the semiconductor memory device 100 may be integrated into a single semiconductor device to configure a memory card, where examples of memory cards include, but are not limited to, a PC card, a Personal Computer Memory Card International Association (PCMCIA), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1100 and the semiconductor memory device 100 may be integrated into a single semiconductor device to configure a semiconductor drive. An example of a semiconductor drive is a Solid State Drive (SSD). The semiconductor drive (SSD) includes a storage device configured to store data in a semiconductor memory. In a case where the memory system 2000 is used as the SSD, a speed of the operation of the host electrically coupled to the memory system 2000 may be improved.

The memory system 1000 is provided as one of various elements of an electronic device. Examples of such electronic devices include, but are not limited to, a computer, an ultra mobile PC (UMPC), a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable of transceiving information in a wireless environment, one of various electronic devices configuring a home network, one of various electronic devices configuring a computer network, one of various electronic devices configuring a telematics network, an RFID device, and one of various constituent elements devices configuring a computing system.

In an embodiment, the semiconductor memory device 100 or the memory system 1000 may be mounted within various types of packages. For example, the semiconductor memory device 100 or the memory system 2000 may be packaged and mounted by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 8:
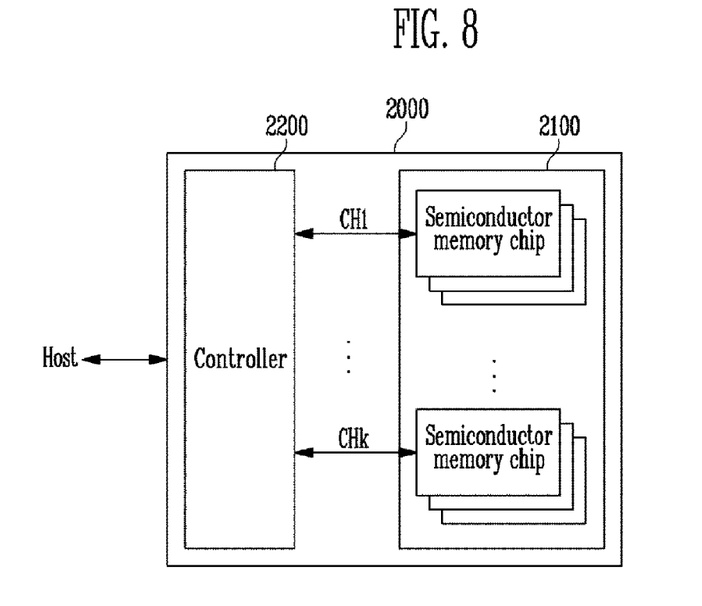
FIG. 8 is a block diagram representation of an example of the memory system of FIG. 7.

Referring to FIG. 8 a block diagram representation of an example of the memory system of FIG. 7 is shown.

The memory system 2000 includes a semiconductor memory device 100 and a controller 2100. The semiconductor memory device 2100 includes a plurality of semiconductor memory chips. The plurality of semiconductor memory chips is divided into a plurality of groups.

The plurality of groups of semiconductor memory chips communicate with the controller 2200 through first to $k^{th}$ channels CH1-CHk, respectively. Each semiconductor memory chip may be configured and operated in a manner similar the semiconductor memory device 100 described with reference to FIG. 2.

Each group of semiconductor memory chips is configured to communicate with the controller 2200 through a common channel. The controller 2200 is configured in a manner similar to the controller 1100 described with reference to FIG. 7, and is configured to control the plurality of memory chips of the semiconductor memory device 2100 through the plurality of channels CH1-CHk.

Figure 9:
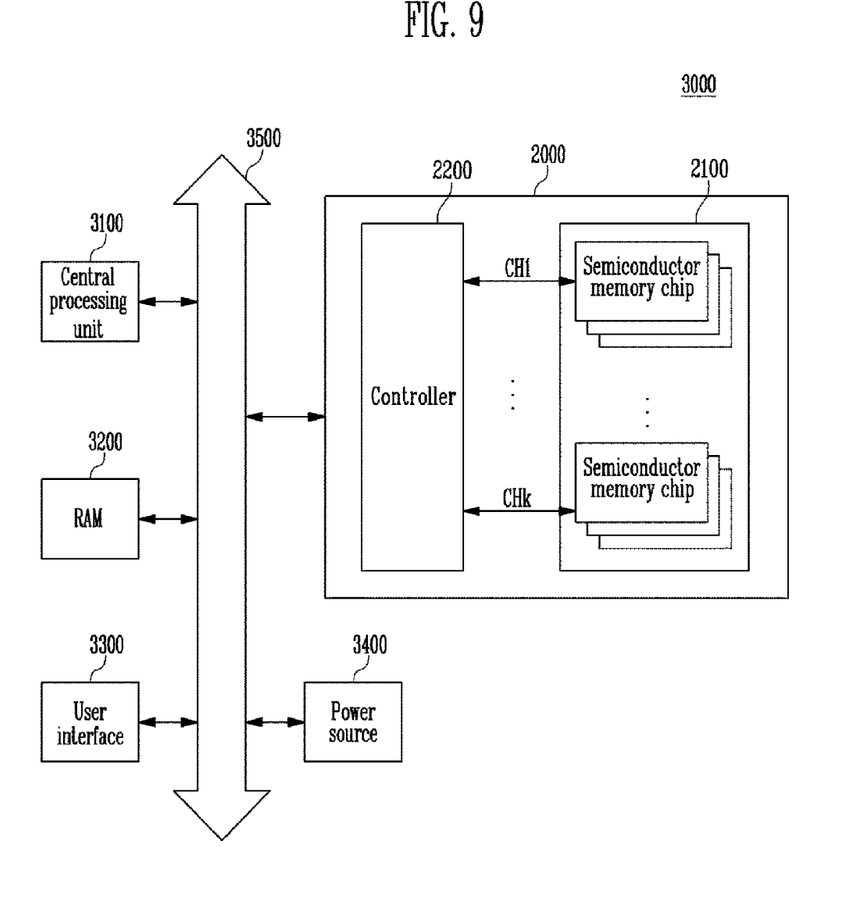
FIG. 9 is a block diagram representation of a computing system including the memory system described with reference to FIG. 8.

Referring to FIG. 9 a block diagram representation of a computing system including the memory system described with reference to FIG. 8 is shown.

The computing system 3000 includes a central processing unit 3100, a Random Access Memory (RAM) 3200, a user interface 3300, a power source 3400, a system bus 3500, and the memory system 2000.

The memory system 2000 is electrically coupled to the central processing unit 3100, the RAM 3200, the user interface 3300, and the power source 3400 via a system bus 3500. Data provided through the user interface 3300 or processed by the central processing unit 3100 is stored in the memory system 2000.

While FIG. 9, shows that the semiconductor memory device 2100 is electrically coupled to the system bus 3500 through the controller 2200, the semiconductor memory device 2100 may be configured to be directly electrically coupled to the system bus 3500. In this case, a function of the controller 2200 may be performed by the central processing unit 3100 and the RAM 4200.

While in FIG. 9, the memory system 2000 described with reference to FIG. 8 is shown, the memory system 1000 described with reference to FIG. 7 may be used in the computing system 3000. In an embodiment, the computing system 3000 may be configured to include all of the memory systems 1000 and 2000 described with reference to FIGS. 8 and 7.

While certain embodiments have been described above, it will be understood to those skilled in the art that the embodiments described are by way of example only. Accordingly, the semiconductor memory devices, memory systems and operating methods described herein should not be limited based on the described embodiments. Rather, the semiconductor memory devices, memory systems and operating methods described herein should only be limited in light of the claims that follow when taken in conjunction with the above description and accompanying drawings.

What is claimed is:

1. A memory system, comprising:
   a semiconductor memory device including a CAM data block for storing CAM data; and
   a controller configured to control an operation of the semiconductor memory device in response to a CAM data program command received from a host,
   wherein, the semiconductor memory device is configured to sequentially perform a pre-program operation and an erase operation of the CAM data block prior to performance of a CAM data program operation associated with the CAM data block.

2. The memory system of claim 1, wherein the CAM data block includes charge trap memory cells.

3. The memory system of claim 1, wherein the semiconductor memory device is configured to perform the pre-program operation and the erase operation a predetermined number of times prior to the performance of the CAM data program operation.

4. The memory system of claim 1, wherein the semiconductor memory device includes:
   a memory cell array including the CAM data block;
   a peripheral circuit configured to perform the pre-program operation and the erase operation of the CAM data block; and
   a control logic configured to perform the pre-program operation and the erase operation by controlling the peripheral circuit under control of the controller.

5. The memory system of claim 1, wherein the CAM data block includes a plurality of memory cells and the pre-program operation is performed on the plurality of memory cells.

6. The memory system of claim 1, wherein the CAM data block includes a plurality of memory cells and the pre-program operation is performed on a subset of the plurality of memory cells.

7. The memory system of claim 1, wherein the CAM data block includes a plurality of charge trap memory cells having a 3-dimensional architecture.

8. A semiconductor memory device, comprising:
   a memory cell array including a CAM data block;
   a peripheral circuit configured to perform a pre-program operation, an erase operation, and a CAM data program operation of the CAM data block; and
   a control logic configured to issue at least one command to the peripheral circuit to sequentially perform the pre-program operation and the erase operation prior to the issuance of a CAM data program command to the peripheral circuit to perform the CAM data program operation.

9. The semiconductor memory device of claim 8, wherein the CAM data block includes charge trap memory cells.

10. The semiconductor memory device of claim 8, wherein the control logic is configured to issue at least one command to the peripheral circuit to perform the pre-program operation and the erase operation a predetermined number of times.

11. The semiconductor memory device of claim 8, wherein the CAM data block includes a plurality of memory cells and the pre-program operation is performed on the plurality of memory cells.

12. The semiconductor memory device of claim 8, wherein the CAM data block includes a plurality of memory cells and the pre-program operation is performed on a subset of the plurality of memory cells.

13. A method of operating a semiconductor memory device, comprising:
    receiving a CAM data program command at a semiconductor memory device including a CAM data block;
    sequentially performing a pre-program operation and an erase operation on the CAM data block; and
    programming CAM data on the CAM data block following the performance of the pre-program operation and the erase operation.

14. The method of claim 13, wherein the CAM data block includes charge trap memory cells.

15. The method of claim 13, wherein sequentially performing a pre-program operation and an erase operation on the CAM data block comprises sequentially performing the pre-program operation and the erase operation on the CAM data block a predetermined number of times.

16. The method of claim 13, wherein the CAM data block includes a plurality of memory cells and sequentially performing a pre-program operation and an erase operation on the CAM data block comprises one of performing the pre-program operation and the erase operation on the plurality of memory cells and performing the pre-program operation and the erase operation on a subset of the plurality of memory cells.

* * * * *